US009369116B2

(12) United States Patent
Nederbragt et al.

(10) Patent No.: US 9,369,116 B2
(45) Date of Patent: Jun. 14, 2016

(54) LEADING-EDGE PHASE-CUT DIMMER DETECTOR

(71) Applicant: Texas Instruments Incorporated, Dallas, TX (US)

(72) Inventors: Irwin Nederbragt, Brighton, CO (US); Steven Barrow, Longmont, CO (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/272,023

(22) Filed: May 7, 2014

(65) Prior Publication Data

US 2014/0361705 A1 Dec. 11, 2014

Related U.S. Application Data

(60) Provisional application No. 61/832,654, filed on Jun. 7, 2013.

(51) Int. Cl.
*H05B 33/08* (2006.01)
*H03K 5/05* (2006.01)
*H03K 5/1534* (2006.01)

(52) U.S. Cl.
CPC ............... *H03K 5/05* (2013.01); *H03K 5/1534* (2013.01); *H05B 33/0809* (2013.01); *H05B 33/0845* (2013.01)

(58) Field of Classification Search
CPC .. H05B 33/0815; H05B 33/0845; H05B 7/02; H05B 7/0227
See application file for complete search history.

(56) References Cited

U.S. PATENT DOCUMENTS

| 8,536,799 | B1* | 9/2013 | Grisamore et al. | ........... 315/294 |
|---|---|---|---|---|
| 2009/0284179 | A1* | 11/2009 | Ray et al. | ........... 315/306 |
| 2010/0327773 | A1* | 12/2010 | Gu et al. | ........... 315/307 |
| 2011/0285303 | A1 | 11/2011 | Deurenberg et al. | |
| 2012/0043913 | A1 | 2/2012 | Melanson | |
| 2012/0049752 | A1 | 3/2012 | King et al. | |
| 2014/0260507 | A1* | 9/2014 | Abawi | ........... 73/1.01 |

OTHER PUBLICATIONS

Search Report for PCT/US14/41601, dated Jun. 9, 2014.

\* cited by examiner

*Primary Examiner* — Tung X Le
*Assistant Examiner* — Raymond R Chai
(74) *Attorney, Agent, or Firm* — William B. Kempler; Frank D. Cimino

(57) ABSTRACT

Circuits and methods for detecting the presence of a leading-edge phase-cut dimmer. The dimmer detector comprises an edge detector, a pulse stretcher and a filter. The edge detector detects whether an input signal has a rapidly rising edge and generates an output signal pulse if a rapidly rising edge is detected. If the edge detector outputs a signal pulse, the pulse stretcher generates a stretched pulse having a duration that is longer than the signal pulse received from the edge detector. The filter produces a dimmer detect signal that indicates whether a leading-edge phase-cut dimmer is detected. If the pulse stretcher output signal comprises at least a predetermined number of stretched pulses within a predetermined amount of time, the dimmer signal signals the presence of a leading-edge phase-cut dimmer.

17 Claims, 5 Drawing Sheets

LEADING-EDGE PHASE-CUT DIMMER DETECTOR

CROSS-REFERENCE TO RELATED APPLICATIONS

This application claims priority to U.S. Provisional Patent Application Ser. No. 61/832,654, filed Jun. 7, 2013, the entire contents of which is hereby incorporated by reference in its entirety.

BACKGROUND

Electronic systems utilize dimmers to modify output power delivered to a load. For example, in a lighting system, dimmers provide an input signal to a lighting system, and the load includes one or more light sources such as one or more light emitting diodes (LEDs). Dimmers can also be used to modify power delivered to other types of loads, such as one or more motors or one or more portable power sources. The input signal represents a dimming level that causes the lighting system to adjust power delivered to a lamp, and, thus, depending on the dimming level, increase or decrease the brightness of the lamp. Many different types of dimmers exist. In general, dimmers use a digital or analog coded dimming signal that indicates a desired dimming level. For example, phase-cut dimmers modulate a phase angle of each cycle of an alternating current supply voltage. Modulating the phase angle of the supply voltage is also commonly referred to as "chopping" or "phase cutting" the supply voltage. Phase cutting the supply voltage causes the voltage supplied to a lighting system to rapidly turn on and off thereby controlling the average power delivered to the lighting system. There are two main types of phase-cut dimmers. One is the leading-edge phase-cut dimmer, which is usually based on a triode for alternating current device ("triac"). The other is the trailing-edge phase-cut dimmer, which is typically transistor based. Leading-edge phase cut dimmers reduce power to the load by delaying the start of each half cycle. Trailing-edge phase-cut dimmers stop the cycle early, leading to a sharp trailing edge in terms of output voltage.

FIG. 1 depicts a lighting system 100 that includes an illustrative triac-based leading-edge phase-cut dimmer 102. It is important to note that FIG. 1 represents only one possible implementation of a triac-based dimmer and that numerous other implementations are possible. FIG. 2 depicts voltage graphs 200 associated with the lighting system 100. Referring to FIGS. 1 and 2, the lighting system 100 receives an AC supply voltage $V_{SUPPLY}$ from voltage supply 104. The supply voltage $V_{SUPPLY}$, indicated by voltage waveform 202, is, for example, a nominally 60 Hz/110 V line voltage in the United States of America or a nominally 50 Hz/220 V line voltage in Europe. Triac 106 acts as voltage-driven switch, and a gate terminal 108 of triac 106 controls current flow between the first terminal 110 and the second terminal 112. A gate voltage $V_G$ on the gate terminal 108 will cause the triac 106 to turn ON and current $I_{DIM}$ when the gate voltage $V_G$ reaches a firing threshold voltage value $V_F$ and a voltage potential exists across the first and second terminals 110 and 112. The dimmer output voltage $V_{DIM}$ is zero volts from the beginning of each of half cycles 202 and 204 at respective times $t_0$ and $t_2$ until the gate voltage $V_G$ reaches the firing threshold voltage value $V_F$. Dimmer output voltage $V_{DIM}$ represents the output voltage of dimmer 102. During timer period $T_{OFF}$, the dimmer 102 chops the supply voltage $V_{SUPPLY}$ so that the dimmer output voltage $V_{DIM}$ remains at zero volts during time period $T_{OFF}$. At time $t_1$, the gate voltage $V_G$ reaches the firing threshold value $V_F$, and triac 106 begins conducting. Once triac 106 turns on, the dimmer voltage $V_{DIM}$ tracks the supply voltage $V_{SUPPLY}$ during time period $T_{ON}$. Once triac 106 turns on, triac 106 continues to conduct current $I_{DIM}$ regardless of the value of the gate voltage $V_G$ as long as the current $I_{DIM}$ remains above a holding current value $I_{HC}$. The holding current value $I_{HC}$ is a function of the physical characteristics of the triac 106. Once the current $I_{DIM}$ drops below the holding current value $I_{HC}$, i.e., $I_{DIM} < I_{HC}$, triac 106 turns off, i.e., stops conducting, until the gate voltage $V_G$ again reaches the firing threshold value $V_F$. The holding current value $I_{HC}$ is generally low enough so that, ideally, the current $I_{DIM}$ drops below the holding current value $I_{HC}$ when the supply voltage $V_{SUPPLY}$ is approximately zero volts near the end of the half cycle 202 at time $t_2$.

The variable resistor 114 in series with the capacitor 116 form a timing circuit to control the time $t_1$ at which the gate voltage $V_G$ reaches the firing threshold value $V_F$. Increasing the resistance of variable resistor 114 increases the time $T_{OFF}$, and decreasing the resistance of variable resistor 114 decreases the time $T_{OFF}$. The resistance value of the variable resistor 114 effectively sets a dimming value for lamp 122. Diac 119 provides current flow into the gate terminal 108 of triac 106. The diode bridge rectifier 118 rectifies the dimmer voltage $V_{DIM}$ to generate rectified voltage VR 208. The LED load 122 comprises one or more LED lamps such as lamps 124 and 126.

Ideally, modulating the phase angle of the dimmer output voltage $V_{DIM}$ effectively turns the lamps 124 and 126 off during time period TOFF and on during time period TON for each half cycle of the supply voltage $V_{SUPPLY}$. Thus, ideally, the dimmer 102 effectively controls the average energy supplied to the lamps 124 and 126 in accordance with the dimmer output voltage $V_{DIM}$. However, when the lamps 124 and 126 draw only a small amount of current (e.g., when the lamps 124 and 126 are relatively low wattage lamps), the current $I_{DIM}$ can prematurely drop below the holding current value $I_{HC}$ before the supply voltage $V_{SUPPLY}$ reaches approximately zero volts. When the current $I_{DIM}$ prematurely drops below the holding current value $I_{HC}$, the dimmer 102 prematurely shuts down, and the dimmer voltage $V_{DIM}$ prematurely drops to zero. When the dimmer voltage $V_{DIM}$ prematurely drops to zero, it does not reflect the intended dimming value as set by the resistance value of variable resistor 114. For example, when the current $I_{DIM}$ drops below the holding current value $I_{HC}$ at time $t_3$ for the dimmer voltage $V_{DIM}$ 206, the ON time period $T_{ON}$ prematurely ends at time $t_3$ rather than at time $t_2$, thereby decreasing the amount of energy delivered to lamps 124 and 126. Thus, the energy delivered to lamps 124 and 126 will not match the dimming level corresponding to the dimmer voltage $V_{DIM}$. Additionally, the triac 106 of leading-edge dimmer 102 can re-engage (conductive) and disengage (non-conductive) repeatedly during a half-cycle of supply voltage $V_{SUPPLY}$ when the current $I_{DIM}$ is below or near the holding current value $I_{HC}$.

Measures can be taken to mitigate the above-described non-ideal operating characteristics of a leading-edge phase-cut dimmer. For that reason, it would be advantageous to know when a leading-edge phase-cut dimmer is present. In general, dimmers do not directly communicate their dimmer type to other circuits that could benefit from knowing the dimmer type.

SUMMARY

One embodiment of the present invention is directed to a circuit for detecting a leading-edge phase-cut dimmer, the circuit including an edge detector, a pulse stretcher and a filter. The edge detector receives an input signal, detects whether the input signal has a rapidly rising edge, and generates an edge detector output signal. The edge detector output signal comprises a signal pulse if a rapidly rising edge is detected in the input signal. The pulse stretcher receives the edge detector output signal and generates a pulse stretcher output signal. If the edge detector output signal comprises a signal pulse, the pulse stretcher output signal comprises a stretched pulse having a duration that is longer than the signal pulse received from the edge detector. The filter receives the pulse stretcher output signal and generates a filter output signal. If the pulse stretcher output signal comprises at least a predetermined number of stretched pulses within a predetermined amount of time, the filter output signal indicates the presence of a leading-edge phase-cut dimmer.

Another embodiment of the present invention is directed to a method for detecting a leading-edge phase-cut dimmer. Pursuant to the method, it is determined whether a received input signal has a rapidly rising edge. If a rapidly rising edge is detected in the input signal, a signal pulse is generated. The signal pulse is stretched to generate a stretched pulse having a duration that is longer than the signal pulse. If at least a predetermined number of stretched pulses are generated within a predetermined amount of time, a signal indicating the presence of a leading-edge phase-cut dimmer is generated.

Another embodiment of the present invention is directed to a circuit for detecting a leading-edge phase-cut dimmer. The circuit includes a light-emitting diode, an edge detector, a pulse stretcher, a filter, and a loading circuit. The light-emitting diode is driven by an LED driver signal. The edge detector receives the LED driver signal, detects whether the LED driver signal has a rapidly rising edge, and provides an edge detector output signal. The edge detector output signal comprises a signal pulse if a rapidly rising edge is detected in the LED driver signal. The pulse stretcher receives the edge detector output signal and provides a pulse stretcher output signal. If the edge detector output signal comprises a signal pulse, the pulse stretcher output signal comprises a stretched pulse having a duration that is longer than the signal pulse received from the edge detector. The filter receives the pulse stretcher output signal and generate an indicator signal. If the pulse stretcher output signal comprises at least a predetermined number of stretched pulses within a predetermined amount of time, the indicator signal indicates the presence of a leading-edge phase-cut dimmer in a circuit generating the LED driver signal. The loading circuit receives the indicator signal. If the indicator signal indicates the presence of a leading-edge phase-cut dimmer, the loading circuit provides a constant current load to the light-emitting diode. If the indicator signal indicates the absence of a leading-edge phase-cut dimmer, the loading circuit provides a high power factor load to the light-emitting diode.

DETAILED DESCRIPTION

Figure 3:
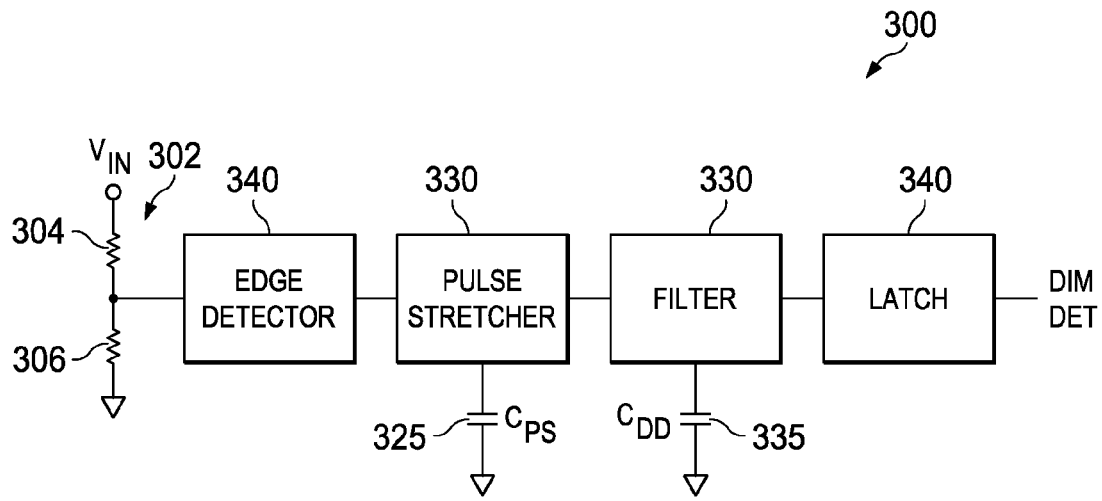
FIG. 3 is a block diagram representing a dimmer detector in accordance with an illustrative embodiment of the present invention.
Figure 2:
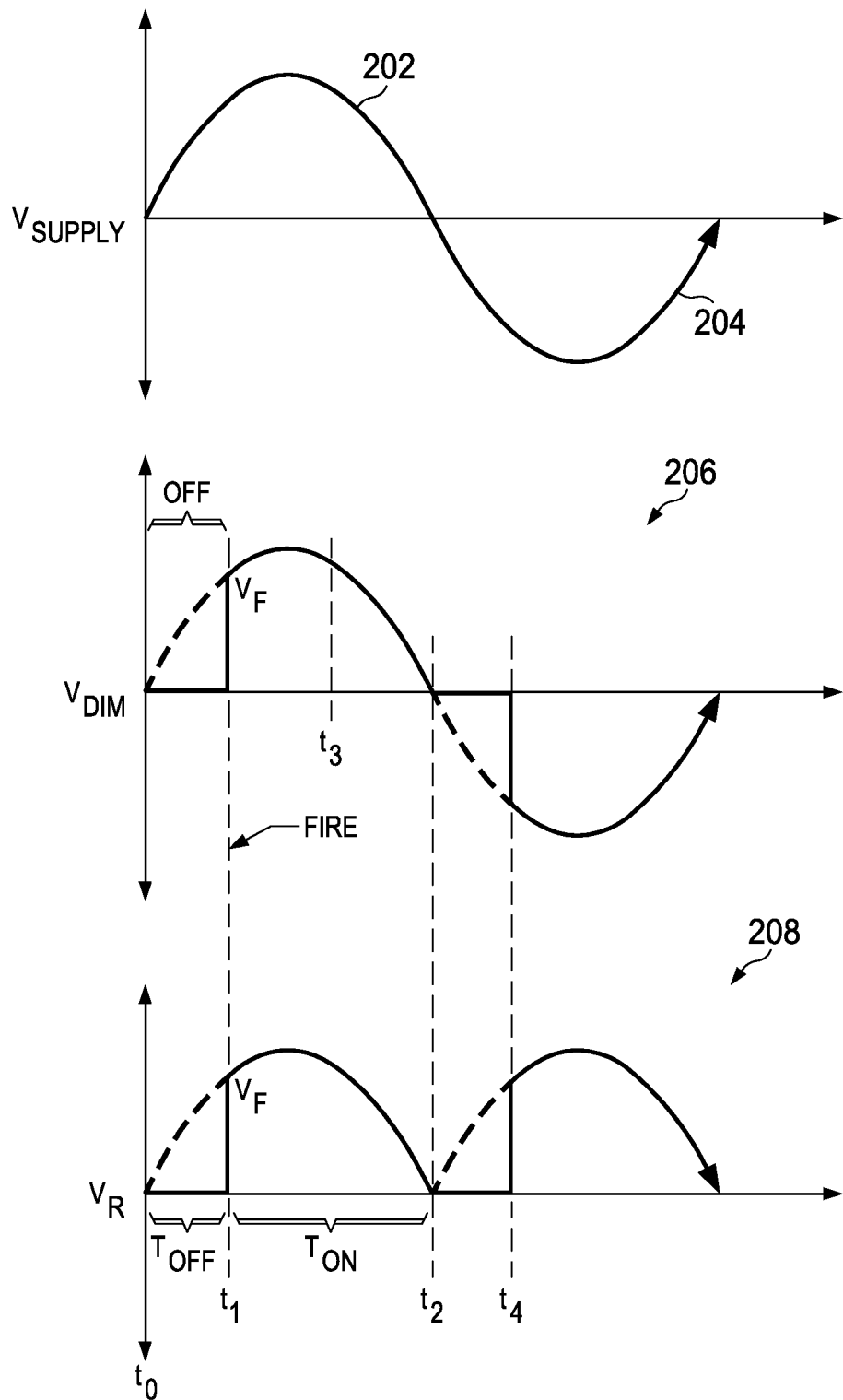
FIG. 2 depicts voltage graphs associated with the lighting system of FIG. 1.

The present invention is directed generally to a method of and circuitry for detecting a leading-edge phase-cut dimmer. FIG. 3 is a block diagram representing a dimmer detector. The detection circuit 300 of FIG. 3 receives at input $V_{in}$ an LED driver signal that is to be provided to an LED lighting assembly, such as the signal $V_R$ 120 that drives the LED lamps 124 and 126. The voltage divider 302, comprising resistors 304 and 306, provides to edge detector 310 an input signal within a desired voltage range. Edge detector 310 will detect a rapidly rising edge in the input signal and generate an output pulse when an edge is detected. In one embodiment, the edge detector will declare that an edge is present in the input signal when the signal includes a large enough voltage transition (0.5V, for example) with a rise time that is greater than a predetermined threshold (dv/dt>1V/100 μs, for example). The output of the edge detector 310 is provided to pulse stretcher 320. If the pulse stretcher 320 receives a pulse from edge detector 310, the pulse stretcher 320 stretches the pulse to a length that is determined by the value of external capacitor $C_{PS}$ 325, as will be described in more detail below. The stretched pulse is provided to filter/reservoir circuit 330. The filter circuit 330 filters out low-frequency random non-periodic noise bursts. The filter 330 generates an output signal indicating the presence of a leading-edge phase-cut dimmer only after a series of stretched pulses are received from the pulse stretcher 320. The number of stretched pulses that must be received in succession in order for the presence of a leading-edge phase-cut dimmer to be declared is determined by the value of the external capacitor 335, as will be described in more detail below. When the filter 330 determines that a leading-edge phase cut dimmer is present, the filter output goes high and the latch 340 is set.

Figure 1:
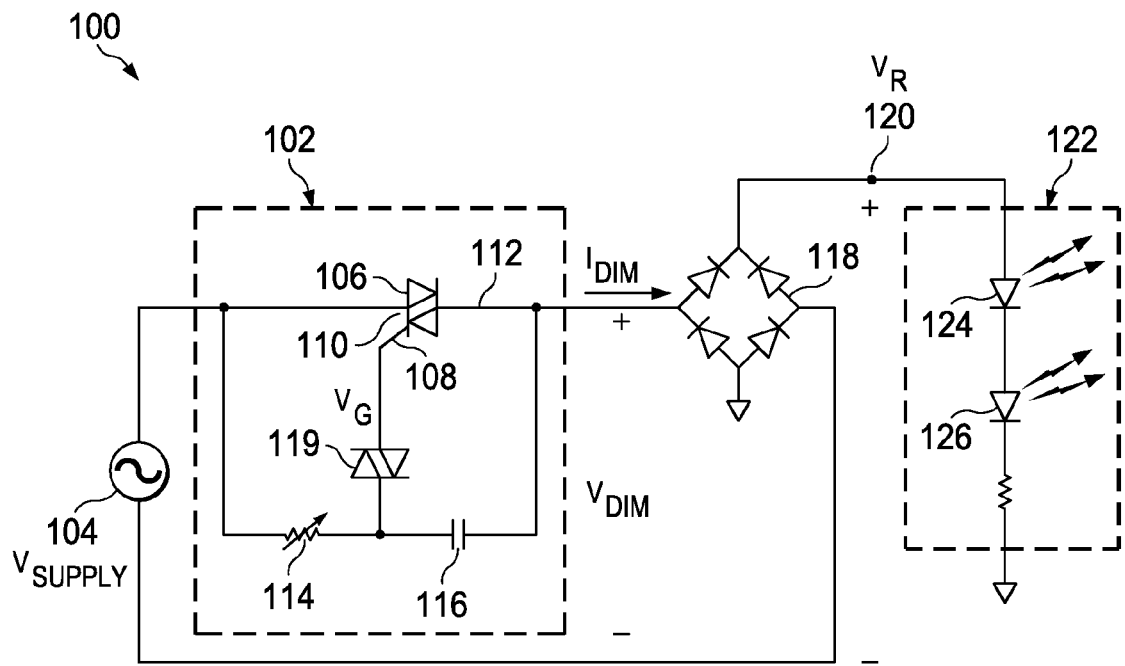
FIG. 1 depicts a prior-art lighting system that includes a triac-based leading-edge phase-cut dimmer.
Figure 4:
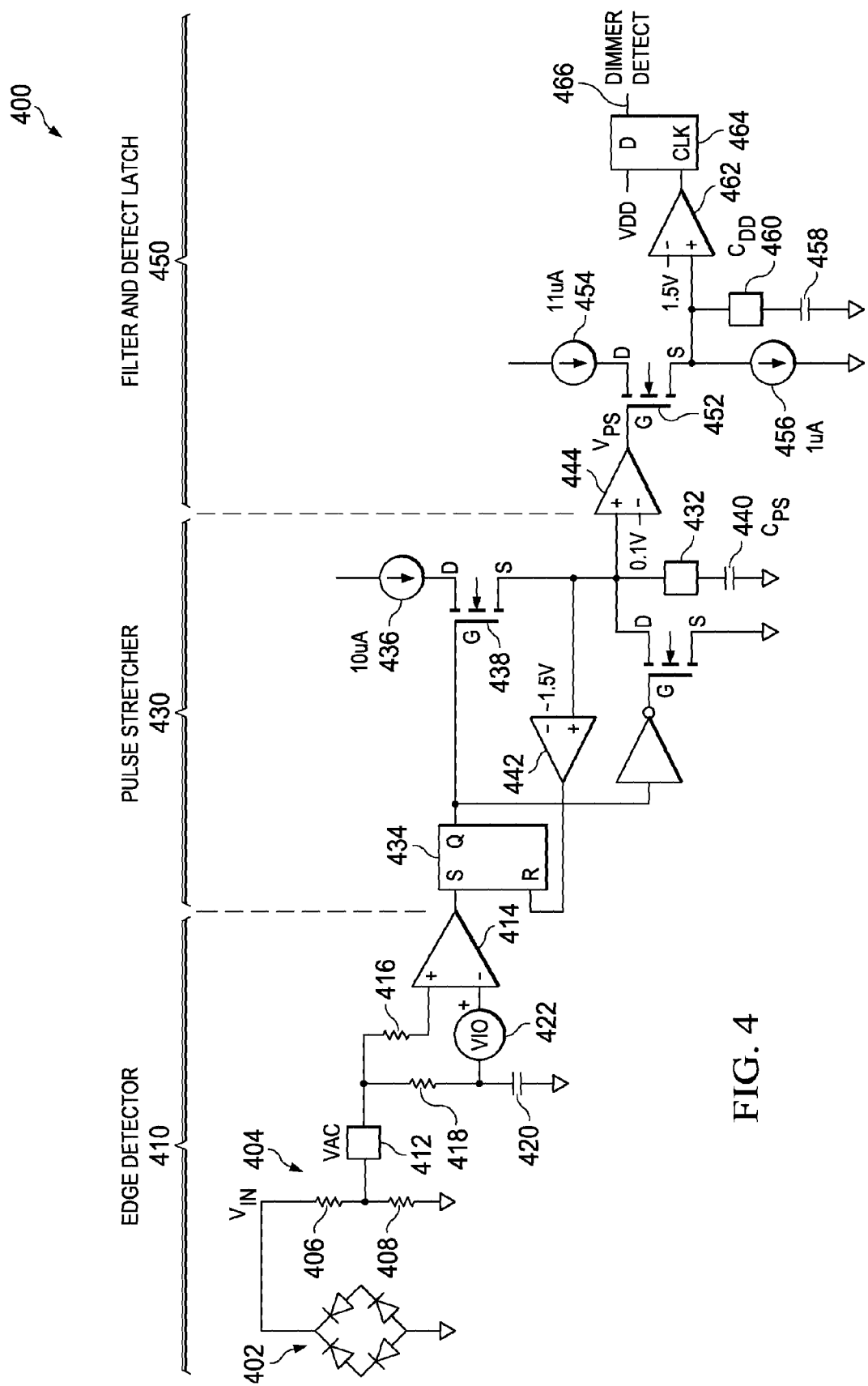
FIG. 4 is a circuit diagram illustrating an illustrative embodiment of the leading-edge phase-cut dimmer detector depicted in FIG. 3.
Figure 5:
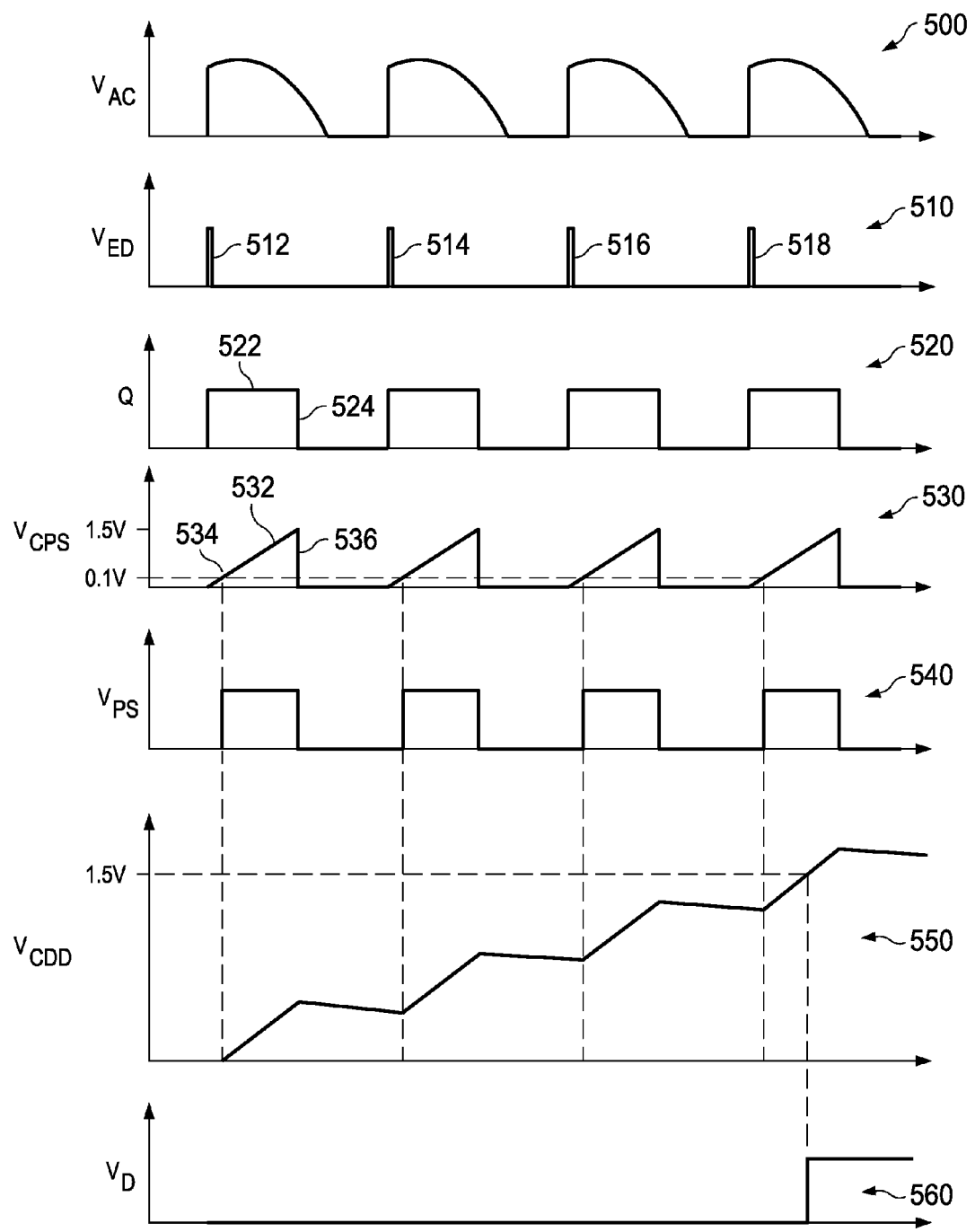
FIG. 5 is a timing diagram showing the timing relationships of various signals represented in FIG. 4.

FIG. 4 is a circuit diagram illustrating an illustrative embodiment of the leading-edge phase-cut dimmer detector depicted in FIG. 3. It is important to note that FIG. 4 represents only one illustrative implementation of the dimmer detector of FIG. 3 and should not be construed to limit the scope of the present invention. The timing diagram of FIG. 5 shows the timing relationships of various signals represented in FIG. 4. The detection circuit 400 of FIG. 4 receives an input signal $V_{in}$ which is an LED driver signal that is to be provided to an LED lighting assembly. In an illustrative embodiment, the input signal $V_{in}$ is received from a diode bridge rectifier 402, such as the diode bridge rectifier 118 of FIG. 1, which drives the LED lamps 124 and 126. The voltage divider 404, comprising resistors 406 and 408, provides an input signal within a desired voltage range to a $V_{AC}$ pin 412 of edge detector 410. An illustrative input signal $V_{AC}$ is represented by graph 500 of FIG. 5. The input signal $V_{AC}$ 500 shown in FIG. 5 is representative of an input signal received from a leading-edge phase-cut dimmer. The edge detector 410 detects rapidly rising edges in the input signal $V_{AC}$. The non-inverting input of comparator 414 receives the input signal $V_{AC}$ via resistor 416. The input signal $V_{AC}$ is also applied to an RC circuit comprising resistor 418 and capacitor 420 in series. An offset voltage $V_{io}$ 422 is applied to the signal taken from the junction of resistor 418 and capacitor 420 and the resulting signal is applied to the inverting input of comparator 414. Fast rising edges on the $V_{AC}$ pin 412 will immediately pull up the non-inverting input of the comparator 414. The inverting input of the comparator 414 will lag due to the RC circuit. If the $V_{AC}$ pulse has a large enough step and rises fast enough to overcome the offset voltage $V_{io}$ 422 and the lag, then the output of the comparator 414 will go high until the lag catches up. This pulse would signal an input step event. If the rise on $V_{AC}$ pin 412 is slow enough, the two inputs of comparator 414 will track each other and the output of the comparator 414 will remain low, signaling that no edge is detected. Graph 510 of FIG. 5 shows an illustrative output $V_{ED}$ of the edge detector 410, i.e., the output of comparator 414. The illustrative edge detector output $V_{ED}$ 510 shown in FIG. 5 includes a series of pulses 512-518 generated in response to the edges in the input signal $V_{AC}$ 500.

The pulse stretcher 430 receives any pulse generated by the edge detector 410 and stretches it to a pulse having a longer, fixed duration. Prior to an input edge in the input signal at $V_{AC}$ pin 412, $C_{PS}$ pin 432 is held at ground. If an edge occurs in the input signal $V_{AC}$, the resulting pulse generated by the edge detector 410 will set the R-S latch 434, causing the output Q of the latch 434 to go high, as shown in graph 520 at 522, for example. With the latch 434 set, a current source 436 is connected to the $C_{PS}$ pin 432 through switch 438 and starts to charge the $C_{PS}$ capacitor 440. In the illustrative embodiment depicted in FIG. 4, the switch 438 is implemented as an n-channel field-effect transistor, and the source current source 436 is 11 μA. The capacitor voltage $V_{CPS}$ on pin 432 will rise at a rate determined by the capacitance value of the capacitor 440, as shown at 532 of graph 530, e.g. When the voltage $V_{CPS}$ surpasses a predetermined threshold, as shown at 534, e.g., of graph 530, the output $V_{PS}$ of the comparator 444 goes high, as shown at 542, e.g., of graph 540. In the illustrative embodiment represented by FIGS. 4 and 5, this threshold is 0.1 V. When the voltage $V_{CPS}$ surpasses a second predetermined threshold, the output of the comparator 442 goes high, thereby resetting the R-S latch 434. In the illustrative embodiment represented by FIGS. 4 and 5, this second threshold is 1.5 V. With the output Q of the R-S latch 434 returning to low, at 524 of graph 520, e.g., the transistor 438 is turned off and the $C_{PS}$ pin 432 is pulled low, as shown, e.g., at 534 of graph 530. With the voltage $V_{CPS}$ at $C_{PS}$ pin 432 once again being at a level of 0 V, the output $V_{PS}$ of the comparator 444 goes low, as shown at 544, e.g., of graph 540. Since the value of the capacitor $C_{PS}$ controls the rise rate of the voltage $V_{CPS}$ across the capacitor, and therefore the amount of time that it takes $V_{CPS}$ to reach the voltage threshold of 1.5 V, the value of the capacitor $C_{PS}$ controls the length of time that the R-S latch 434 remains set after being set by a pulse received from the edge detector 410, and also the width of the stretched pulses $V_{PS}$ output by the pulse stretcher 430.

The filter 450 filters the signal $V_{PS}$ received from the pulse stretcher 430 and signals that a dimmer is detected if a predetermined number of stretched pulses are received in succession from the pulse stretcher 430. The output $V_{PS}$ of the comparator 444 is coupled to the gate of switch 452. In the illustrative embodiment depicted in FIG. 4, the switch 452 is implemented as an n-channel field-effect transistor. A first current source 454 is coupled to the drain of transistor 452 and a second current source 456, of lower magnitude than the first current source 454, is coupled to the source. In the illustrative embodiment depicted in FIG. 4, the drain current source 454 is 11 μA and the source current source is 1 μA. Therefore, any time that the output $V_{PS}$ of the comparator 444 is high, signaling that an edge has been detected in the input signal $V_{AC}$, the transistor 452 is turned on and the capacitor $C_{DD}$ 458 is charged with a current of 10 μA (11 μA-1 μA). Conversely, any time that the output $V_{PS}$ of the comparator 444 is low, the transistor 452 is turned off and the capacitor $C_{DD}$ 458 is discharged by the 1 μA current source 456. Therefore, the capacitor $C_{DD}$ 458 charges 10 times faster than it discharges, as can be seen in graph 550 of FIG. 5. The signal $V_{CDD}$ present at pin 460 is provided to comparator 462. In the illustrative embodiment of FIG. 4, the comparator 462 compares the signal $V_{CDD}$ to a threshold voltage of 1.5 V. When the $V_{CDD}$ signal 460 surpasses 1.5V, the output of comparator 462 goes high, signaling that a leading-edge phase-cut dimmer is detected. It can be seen in graph 550 that it requires multiple stretched pulses from the pulse stretcher 430 to charge the capacitor $C_{DD}$ 458 sufficiently to reach the 1.5 V threshold. Thus, in the event that low-frequency random non-periodic noise triggers the edge detector 410, the filter 450 will filter the noise by requiring the detection of multiple pulses in succession, and in a predetermined frequency range, before declaring that a leading-edge phase-cut dimmer is detected. The pulse width of the stretched pulses (which is determined by the size of the $C_{PS}$ capacitor 440) and the size of capacitor $C_{DD}$ 458 determine how long, and therefore how many pulses from the pulse stretcher 430, it will take to charge capacitor $C_{DD}$ 458 enough to overcome the 1.5 V threshold.

Thus a user can customize the parameters of the detector 400 by selecting the values of the capacitors $C_{PS}$ and $C_{DD}$. This allows the user to determine the number of phase-cut edges that must be detected in a certain amount of time in order to confirm that a dimmer is present. The $C_{PS}$ capacitor 440 determines how long to charge the $C_{DD}$ capacitor 458 per line cycle. The $C_{DD}$ capacitor 458 determines how many pulses are required to declare that a leading-edge phase-cut dimmer is detected. In an illustrative embodiment of the present invention, the $C_{PS}$ capacitor 440 and the $C_{DD}$ capacitor 458 are external to an integrated circuit package which houses all of the elements of FIG. 5 that reside on the other side of pins 412, 432, and 460.

The output of comparator 462 is coupled to the clock input of a D flip-flop latch 464. The D input of the D flip-flop 464 is coupled to the power supply $V_{DD}$. The output of the latch provides a dimmer detect signal 466. Thus when the voltage $V_{CDD}$ at pin 460 surpasses 1.5 V, the clock input of the D flip-flop 464 goes high and the latch 464 is set, signaling that a leading-edge phase-cut dimmer is detected. To reset the latch 464, a full power cycle of $V_{OD}$ must occur.

Figure 6:
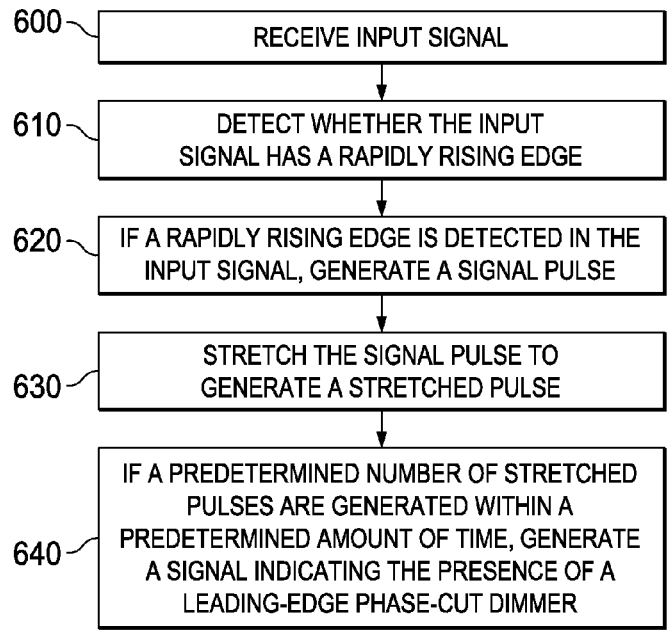
FIG. 6 is a flowchart representing a method for detecting a leading-edge phase-cut dimmer in accordance with an illustrative embodiment of the present invention.

FIG. 6 is a flowchart representing a method for detecting a leading-edge phase-cut dimmer. At step 600, an input signal, such as the $V_{AC}$ signal 412 in FIG. 4, is received. At step 610, it is determined whether the received input signal has a rapidly rising edge. At step 620, if a rapidly rising edge is detected in the input signal, a signal pulse is generated by the edge detector 410. At step 630, the pulse stretcher 430 stretches the signal pulse received from the edge detector 410 to generate a stretched pulse having a duration that is longer than the duration of the signal pulse generated by the edge detector 410. The width of the stretched pulse is determined by the value of the $C_{PS}$ capacitor 440. At step 640, if at least a predetermined number of stretched pulses are generated by the pulse stretcher 430 within a predetermined amount of time, the filter 450 generates a signal indicating the presence of a leading-edge phase-cut dimmer.

In an illustrative embodiment of the present invention, the dimmer detect signal generated by the leading-edge phase-cut dimmer detector is provided to hardware and/or software which then uses the information to help optimize the performance of the LED lighting device. In one embodiment, a constant current load is applied to the LED lighting device if a leading-edge phase-cut dimmer is detected, whereas a load having a high power factor is applied if no leading-edge phase-cut dimmer is detected. This is done because triac-controlled leading-edge phase-cut dimmers require a minimum hold current in order to prevent misfire and flickering. But a constant current load results in poor power factor and high THD (total harmonic distortion).

Figure 7:
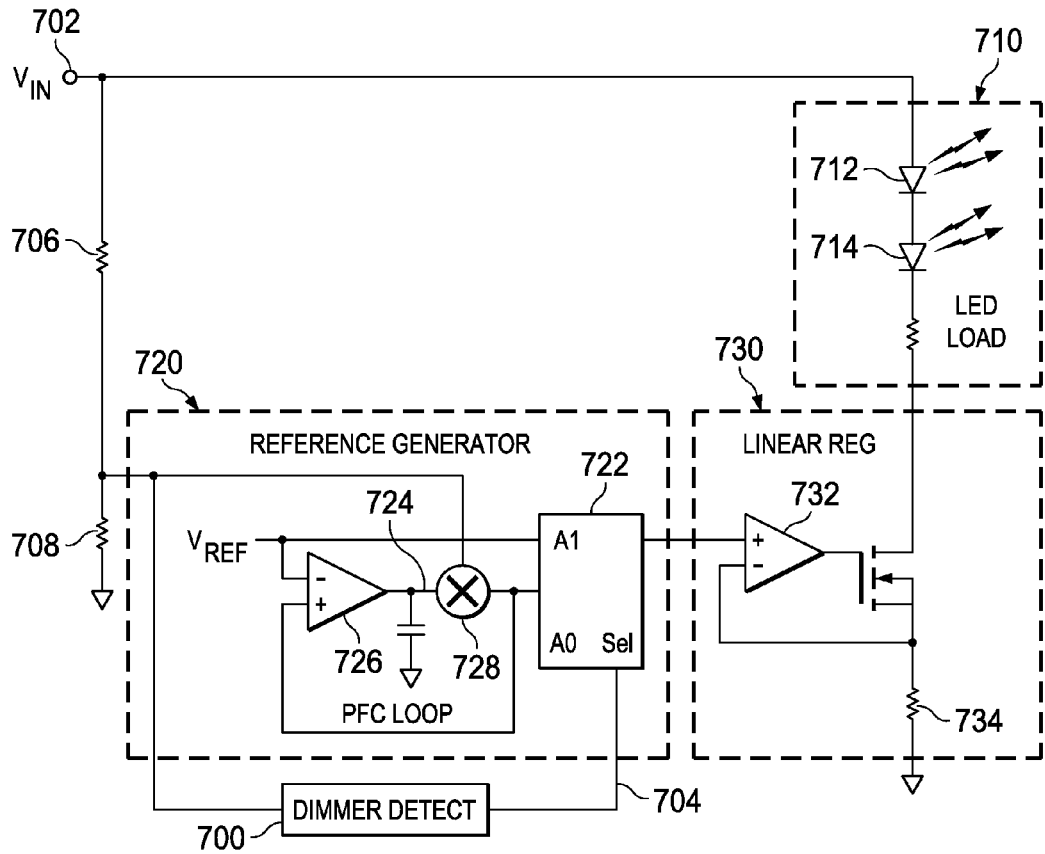
FIG. 7 is a circuit diagram of an LED lighting device in accordance with an illustrative embodiment of the present invention.

FIG. 7 is a circuit diagram of an LED lighting device according to an illustrative embodiment of the present invention. The leading-edge phase-cut dimmer detector 700 corresponds to the leading-edge phase-cut dimmer detector 300 in FIG. 3, and in one embodiment, is implemented as the leading-edge phase-cut dimmer detector 400 of FIG. 4. The resistors 706 and 708 form a resistive ladder in the same manner as the resistors 406 and 408 in FIG. 4. The dimmer detect circuit 700 generates a dimmer detect signal 704 which indicates whether the dimmer detect circuit 700 has detected a leading-edge phase-cut dimmer. That is, dimmer detect signal 704 indicates whether the input signal $V_{in}$ 702 has been received from, or generated by, or processed by, a leading-edge phase-cut dimmer. The dimmer detect signal 704 is provided to the select input of multiplexer 722 of reference generator 720. Illustratively, if the dimmer detect circuit 600 detects a leading-edge phase-cut dimmer, the dimmer detect circuit provides a logical "1" to the multiplexer 722, otherwise it provides a logical "0." The reference generator 720 generates a reference voltage that feeds into the linear regulator 730, which regulates the load current of the LED lighting device 710. The $A_1$ input of the MUX 722 is coupled to a fixed reference voltage $V_{REF}$. The reference voltage is also provided to a power factor correction PFC loop 724 that modifies $V_{REF}$ with the rectified AC input signal $V_{in}$ and provides the modified signal to the $A_0$ input of MUX 722. The modified reference signal ($A_0$ MUX input) is generated by mixing the divided-down $V_{in}$ input and the output of the operational transconductance amplifier (OTA) 726. The output of mixer 728 has an average value equal to $V_{REF}$ but has the shape of $V_{in}$. The PFC loop 724 allows the creation of a sinusoidal waveform in phase with $V_{in}$ that does not change amplitude when the input voltage changes amplitude.

The output of the MUX 722 is provided to the linear regulator circuit 730 that provides a load to the LED lighting device 710 comprising LEDs 712 and 714. If the select input of the MUX 722 is high, indicating the presence of a leading-edge phase-cut dimmer, the MUX outputs the reference voltage $V_{REF}$ to the linear regulator circuit 730. If the select input of the MUX 722 is low, indicating that a leading-edge phase-cut dimmer is not detected, the MUX provides the output of the power factor correction loop 724 to the linear regulator circuit 730. The linear regulator determines what current to sink through the LED string based on the signal received from the reference generator 720. Error amplifier 732 takes the voltage across a current sense resistor 734 and tries to make it the same as the reference generator voltage. So instead of regulating voltage, this regulates current. If the current is too high the voltage across the current sense resistor 734 would be higher than the reference. The error amplifier 732 would then lower the gate voltage to try and get the feedback voltage (the voltage generated across the current sense resistor) back to the reference generator voltage. In the absence of a leading-edge phase-cut dimmer, high power factor correction is desired. Therefore, the current regulation will depend on the output of the power factor correction loop 724 of the reference generator 720. This way the load to the line looks like a resistor (voltage and current waveforms are the same shape), thus providing a high-power-factor load to the LED lighting device 710. On the other hand, when a leading-edge phase-cut dimmer is detected, the reference voltage is fixed DC so the current regulator 730 tries to regulate a fixed DC current, thus providing a constant current load to the LED lighting device 710.

Having thus described circuits and methods for detecting a leading-edge phase-cut dimmer by reference to certain of its preferred embodiments, it is noted that the embodiments disclosed are illustrative rather than limiting in nature and that a wide range of variations, modifications, changes, and substitutions are contemplated in the foregoing disclosure. For example, while the switches 438 and 452 of FIG. 4 are implemented as n-channel field-effect transistors, it will be recognized that said switches can be implemented using any of a multitude of switch technologies. Furthermore, in some instances, some features of the present invention may be employed without a corresponding use of the other features. Accordingly, it is appropriate that the appended claims be construed broadly and in a manner consistent with the broad inventive concepts disclosed herein.

What is claimed is:

1. A circuit for detecting a leading-edge phase-cut dimmer, comprising:
   an edge detector operable to receive an input signal, detect whether the input signal has a rapidly rising edge, and generate an edge detector output signal, wherein the edge detector output signal comprises a signal pulse if a rapidly rising edge is detected in the input signal;
   a pulse stretcher operable to receive the edge detector output signal and generate a pulse stretcher output signal, wherein if the edge detector output signal comprises a signal pulse, the pulse stretcher output signal comprises a stretched pulse having a duration that is longer than the signal pulse received from the edge detector; and
   a filter operable to receive the pulse stretcher output signal and generate a filter output signal, wherein if the pulse stretcher output signal comprises at least a predetermined number of stretched pulses within a predetermined amount of time, the filter output signal indicates the presence of a leading-edge phase-cut dimmer, the filter comprising a filter capacitor whose value in part determines the number of stretched pulses that must be received from the pulse stretcher before the presence of a leading-edge phase-cut dimmer is indicated.

2. The circuit of claim 1, wherein the edge detector comprises:
   an edge detector comparator configured to receive the input signal at a first input of the edge detector comparator, the output of the edge detector comparator representing the edge detector output signal;
   an RC circuit comprising a RC resistor having a first end coupled to the input signal and a second end coupled to a RC capacitor; and
   an offset voltage source coupled to the junction of the RC resistor and the RC capacitor of the RC circuit, operable to add a voltage offset to the signal present at the junction of the RC resistor and the RC capacitor, and providing the resulting offset signal to the second input of the edge detector comparator.

3. The circuit of claim 1, wherein the pulse stretcher comprises
   a pulse stretcher capacitor whose value determines the pulse width of any stretched pulse generated by the pulse stretcher.

4. The circuit of claim 1, wherein the pulse stretcher comprises:

an R-S flip-flop coupled to receive the edge detector output signal at its S input;

a first pulse stretcher switch coupled to receive the output of the R-S flip-flop at a first terminal, wherein a voltage at said first terminal controls current flow from a second terminal of the first pulse stretcher switch to a third terminal of the first pulse stretcher switch;

a first pulse stretcher current source supplying a fixed current to the second terminal of the switch;

a first pulse stretcher comparator coupled to receive a signal present at the third terminal of the first pulse stretcher switch, compare it to a first reference voltage level, and output a logical "1" if the signal present at the third terminal of the first pulse stretcher switch is greater than the reference voltage, the output of the first pulse stretcher comparator being coupled to the R input of the R-S flip-flop; and a second pulse stretcher comparator coupled to receive the signal present at the third terminal of the first pulse stretcher switch, compare it to a second reference voltage level lower than the first reference voltage level, and output a logical "1" if the signal present at the third terminal of the first pulse stretcher switch is greater than the reference voltage, the output of the second pulse stretcher comparator representing the output of the pulse stretcher.

5. The circuit of claim 4, wherein the pulse stretcher further comprises a pulse stretcher capacitor coupled to the third terminal of the first pulse stretcher switch.

6. The circuit of claim 1, wherein the filter comprises:

a filter switch coupled to receive the pulse stretcher output signal at a first terminal, wherein a voltage at said first terminal controls current flow from a second terminal of the filter switch to a third terminal of the filter switch; a first filter current source supplying a fixed current to the first terminal of the filter switch; a second filter current source connected to the third terminal of the filter switch and providing a fixed current flowing away from said third terminal, wherein a magnitude of the second filter current source is lower than a magnitude of the first filter current source; and a filter comparator coupled to receive the signal present at the third terminal of the filter switch, compare it with a reference voltage level, and output a logical "1" if the signal present at the third terminal of the filter switch is greater than the reference voltage.

7. The circuit of claim 6, wherein
the filter capacitor is coupled to the third terminal of the filter switch.

8. The circuit of claim 1, wherein the circuit further comprises a latch operable to receive the filter output signal and to latch a filter output signal that indicates the presence of a leading-edge phase-cut dimmer.

9. A method for detecting a leading-edge phase-cut dimmer, comprising: receiving an input signal; detecting whether the input signal has a rapidly rising edge; if a rapidly rising edge is detected in the input signal, generating a signal pulse; stretching the signal pulse to generate a stretched pulse having a duration that is longer than the duration of the signal pulse; and if at least a predetermined number of stretched pulses are generated within a predetermined amount of time, generating a signal indicating the presence of a leading-edge phase-cut dimmer; if a signal indicating the presence of a leading-edge phase-cut dimmer is generated, providing a constant current load to an LED lighting device; and if a signal indicating the presence of a leading-edge phase-cut dimmer is not generated, providing a high-power-factor load to an LED lighting device.

10. A circuit for detecting a leading-edge phase-cut dimmer, comprising:

a light-emitting diode driven by an LED driver signal;

an edge detector operable to receive the LED driver signal, detect whether the LED driver signal has a rapidly rising edge, and provide an edge detector output signal, wherein the edge detector output signal comprises a signal pulse if a rapidly rising edge is detected in the LED driver signal;

a pulse stretcher operable to receive the edge detector output signal and provide a pulse stretcher output signal, wherein if the edge detector output signal comprises a signal pulse, the pulse stretcher output signal comprises a stretched pulse having a duration that is longer than the signal pulse received from the edge detector;

a filter operable to receive the pulse stretcher output signal and generate an indicator signal, wherein
the filter comprises a filter capacitor whose value in part determines the number of stretched pulses that must be received from the pulse stretcher before the presence of a leading-edge phase-cut dimmer is indicated, and
wherein if the pulse stretcher output signal comprises at least a predetermined number of stretched pulses within a predetermined amount of time, the indicator signal indicates the presence of a leading-edge phase-cut dimmer in a circuit generating the LED driver signal; and a loading circuit configured to receive the indicator signal and, if the indicator signal indicates the presence of a leading-edge phase-cut dimmer, provide a constant current load to the light-emitting diode, and, if the indicator signal indicates the absence of a leading-edge phase-cut dimmer, provide a high power factor load to the light-emitting diode.

11. The circuit of claim 10, wherein the edge detector comprises:

an edge detector comparator configured to receive the input signal at a first input of the edge detector comparator, the output of the edge detector comparator representing the edge detector output signal;

an RC circuit comprising a RC resistor having a first end coupled to the input signal and a second end coupled to a RC capacitor; and an offset voltage source coupled to the junction of the RC resistor and the RC capacitor of the RC circuit, operable to add a voltage offset to the signal present at the junction of the RC resistor and the RC capacitor, and providing the resulting offset signal to the second input of the edge detector comparator.

12. The circuit of claim 10, wherein the pulse stretcher comprises a pulse stretcher capacitor whose value determines the pulse width of any stretched pulse generated by the pulse stretcher.

13. The circuit of claim 10, wherein the pulse stretcher comprises:

an R-S flip-flop coupled to receive the edge detector output signal at its S input;

a first pulse stretcher switch coupled to receive the output of the R-S flip-flop at a first terminal, wherein a voltage at said first terminal controls current flow from a second terminal of the first pulse stretcher switch to a third terminal of the first pulse stretcher switch;

a first pulse stretcher current source supplying a fixed current to the second terminal of the switch;

a first pulse stretcher comparator coupled to receive a signal present at the third terminal of the first pulse stretcher switch, compare it to a first reference voltage level, and output a logical "1" if the signal present at the third terminal of the first pulse stretcher switch is greater than the reference voltage, the output of the first pulse stretcher comparator being coupled to the R input of the R-S flip-flop; and a second pulse stretcher comparator coupled to receive the signal present at the third terminal of the first pulse stretcher switch, compare it to a second reference voltage level lower than the first reference voltage level, and output a logical "1" if the signal present at the third terminal of the first pulse stretcher switch is greater than the reference voltage, the output of the second pulse stretcher comparator representing the output of the pulse stretcher.

14. The circuit of claim 13, wherein the pulse stretcher further comprises a pulse stretcher capacitor coupled to the third terminal of the first pulse stretcher switch.

15. The circuit of claim 10, wherein the loading circuit comprises a multiplexer configured to receive the indicator signal at its select input, wherein if the indicator signal indicates the presence of a leading-edge phase-cut dimmer, the multiplexer outputs a first signal that causes a constant current load to be provided to the light-emitting diode, and, if the indicator signal indicates the absence of a leading-edge phase-cut dimmer, the multiplexer outputs a second signal that causes a high power factor load to be provided to the light-emitting diode.

16. A circuit for detecting a leading-edge phase-cut dimmer, comprising:

a light-emitting diode driven by an LED driver signal;

an edge detector operable to receive the LED driver signal, detect whether the LED driver signal has a rapidly rising edge, and provide an edge detector output signal, wherein the edge detector output signal comprises a signal pulse if a rapidly rising edge is detected in the LED driver signal;

a pulse stretcher operable to receive the edge detector output signal and provide a pulse stretcher output signal, wherein if the edge detector output signal comprises a signal pulse, the pulse stretcher output signal comprises a stretched pulse having a duration that is longer than the signal pulse received from the edge detector;

a filter operable to receive the pulse stretcher output signal and generate an indicator signal, wherein the filter comprises:

a filter switch coupled to receive the pulse stretcher output signal at a first terminal, wherein a voltage at said first terminal controls current flow from a second terminal of the filter switch to a third terminal of the filter switch;

a first filter current source supplying a fixed current to the first terminal of the filter switch;

a second filter current source connected to the third terminal of the filter switch and providing a fixed current flowing away from said third terminal, wherein a magnitude of the second filter current source is lower than a magnitude of the first filter current source; and a filter comparator coupled to receive the signal present at the third terminal of the filter switch, compare it with a reference voltage level, and output a logical "1" if the signal present at the third terminal of the filter switch is greater than the reference voltage and wherein if the pulse stretcher output signal comprises at least a predetermined number of stretched pulses within a predetermined amount of time, the indicator signal indicates the presence of a leading-edge phase-cut dimmer in a circuit generating the LED driver signal; and a loading circuit configured to receive the indicator signal and, if the indicator signal indicates the presence of a leading-edge phase-cut dimmer, provide a constant current load to the light-emitting diode, and, if the indicator signal indicates the absence of a leading-edge phase-cut dimmer, provide a high power factor load to the light-emitting diode.

17. The circuit of claim 16, wherein the filter further comprises a filter capacitor coupled to the third terminal of the filter switch.

* * * * *